United States Patent [19]

Hairston

[11] Patent Number: 5,523,570
[45] Date of Patent: Jun. 4, 1996

[54] DOUBLE DIRECT INJECTION DUAL BAND SENSOR READOUT INPUT CIRCUIT

[75] Inventor: Allen W. Hairston, Andover, Mass.

[73] Assignee: Loral Infrared & Imaging Systems, Inc., Lexington, Mass.

[21] Appl. No.: 276,037

[22] Filed: Jul. 15, 1994

[51] Int. Cl.⁶ .................................................. H01L 27/00
[52] U.S. Cl. ................ 250/349; 250/338.4; 250/339.02; 250/370.13; 327/336
[58] Field of Search ..................................... 327/342, 336; 250/370.13, 349, 339.02, 339.01, 338.4

[56]  References Cited

U.S. PATENT DOCUMENTS

| 3,714,432 | 1/1973 | Jalink, Jr. ................................. 250/340 |
| 4,867,520 | 9/1989 | Weidel ..................................... 359/115 |
| 4,956,686 | 9/1990 | Borello et al. ............................ 257/440 |
| 5,002,392 | 3/1991 | Swope et al. ............................. 356/328 |
| 5,014,216 | 5/1991 | Stafford et al. .......................... 364/496 |
| 5,041,890 | 8/1991 | Pruvot ...................................... 257/214 |
| 5,105,277 | 4/1992 | Hayes et al. .............................. 348/313 |
| 5,155,348 | 10/1992 | Ballingal et al. ....................... 250/208.1 |

*Primary Examiner*—Constantine Hannaher
*Attorney, Agent, or Firm*—Leone & Moffa

[57]  ABSTRACT

A double direct injection dual band focal plane array input circuit provides simultaneous and separate integration of the current from two sensors which share a common node. The sensors are constant voltage and variable current sensors such as HgCdTe infrared photodiodes. The sensor voltage biases are independently adjustable. Multiple integration of the signal from one sensor may be performed within one integration time of the other sensor. The circuit is used in staring infrared dual band focal plane arrays and may be used process information from more than two sensors.

19 Claims, 4 Drawing Sheets

DOUBLE DIRECT INJECTION DUAL BAND SENSOR READOUT INPUT CIRCUIT

This invention relates to an electronic circuit for processing information from sensors and more particularly to circuitry for simultaneous and separate integration of current from two sensors.

BACKGROUND OF THE INVENTION

Dual band detector arrays comprising a medium wave (MW) diode and a long wave (LW) diode require simultaneous and separate integration of diode current to accurately provide a signal representative of incident radiation. The prior art does not show such a circuit.

Sebastian R. Borrello et al. U.S. Pat. No. 4,956,686 entitled "Two Color Infrared Focal Plane Array" issued Sep. 11, 1990 discloses using a matrix array so that two detectors have a single set of readout lines. Electronic addressing selects the color to be read and multiplexing is done on the detector chip to obtain the desired color. The array uses HgCdTe diodes which provide a lower noise readout. Borrello et al. do not show the process of simultaneously integrating the output from two diodes.

Therefore, it is a motive of the invention to provide a double direct injection dual band multiplexer circuit.

SUMMARY OF THE INVENTION

In contrast to the prior art, the present invention provides a signal processing apparatus. A first signal detector has a first signal output. A second signal detector has a second signal output. Signal integration means for integrating the first signal a plurality of times while the second signal is being integrated once is coupled to the first signal output and the second signal output.

In another aspect, the invention provides a double direct injection input circuit for use as a dual band infrared focal plane array readout input circuit that simultaneously and separately integrates current from two sensors with a common connection. The dual band sensor circuit comprises a medium wave photodetector having a medium wave photocurrent output and a long wave photodetector having a long wave photocurrent output. The long wave photocurrent output is connected to the medium wave photocurrent output. A medium wave voltage bias circuit biases the medium wave photocurrent output, wherein the medium wave voltage bias circuit has a medium wave biased photocurrent output and a medium wave voltage input connected to the medium wave photocurrent output and a long wave voltage bias circuit connected to bias the long wave photocurrent output. The long wave voltage bias circuit has a long wave biased photocurrent output and a long wave voltage input connected to the long wave photocurrent output. A medium wave photocurrent integration circuit integrates the medium wave biased photocurrent output, wherein the medium wave photocurrent integration circuit has a reference voltage input. A long wave photocurrent integration circuit that integrates the long wave biased photocurrent output is connected to the long wave biased photocurrent output and the medium wave biased photocurrent output. A long wave reset circuit resets the long wave photocurrent integration circuit to a predetermined long wave reset voltage. A medium wave reset circuit resets the medium wave photocurrent integration circuit to a predetermined medium wave reset voltage; and a switch floats the medium wave photocurrent integration circuit with a float control output connected to the reference voltage input.

During each integration cycle sensor currents are integrated and read by following circuits as a voltage. The integration voltage is reset to prepare for the next integration cycle. The sensors may be constant voltage, variable current sensors with the common connections and one independent connection connected to the input circuit and the other independent connection set by an external bias. The bias voltage for the sensors can be independently adjusted. In one embodiment, these sensors are composed of two back-to-back Mercury Cadmium Telluride infrared photodiodes, one of which responds to infrared radiation in the medium wavelength (MW) band (3 to 5 um wavelength) and one of which responds to infrared radiation in the long wavelength (LW) band (8 to 12 um wavelength). The diode structure and input circuit can be made compactly and hybridized using indium bump technology to form staring dual band infrared focal plane arrays. In one embodiment of the invention, multiple LW integration cycles can be performed in a single MW integration cycle, allowing flexibility in transimpedance gain without lowering the percentage of an integration cycle in which integration is performed. The circuit of the invention can also be used with more than two sensors by the addition of multiple floating integration circuit sections and associated sensors.

Other objects, features and advantages of the present invention will become apparent to those skilled in the art through the description of the preferred embodiment, claims and drawings herein wherein like numerals refer to like elements.

BRIEF DESCRIPTION OF THE DRAWINGS

To illustrate this invention, a preferred embodiment will be described herein with reference to the accompanying drawings.

DETAILED DESCRIPTION OF THE PREFERRED EMBODIMENT

Figure 1:
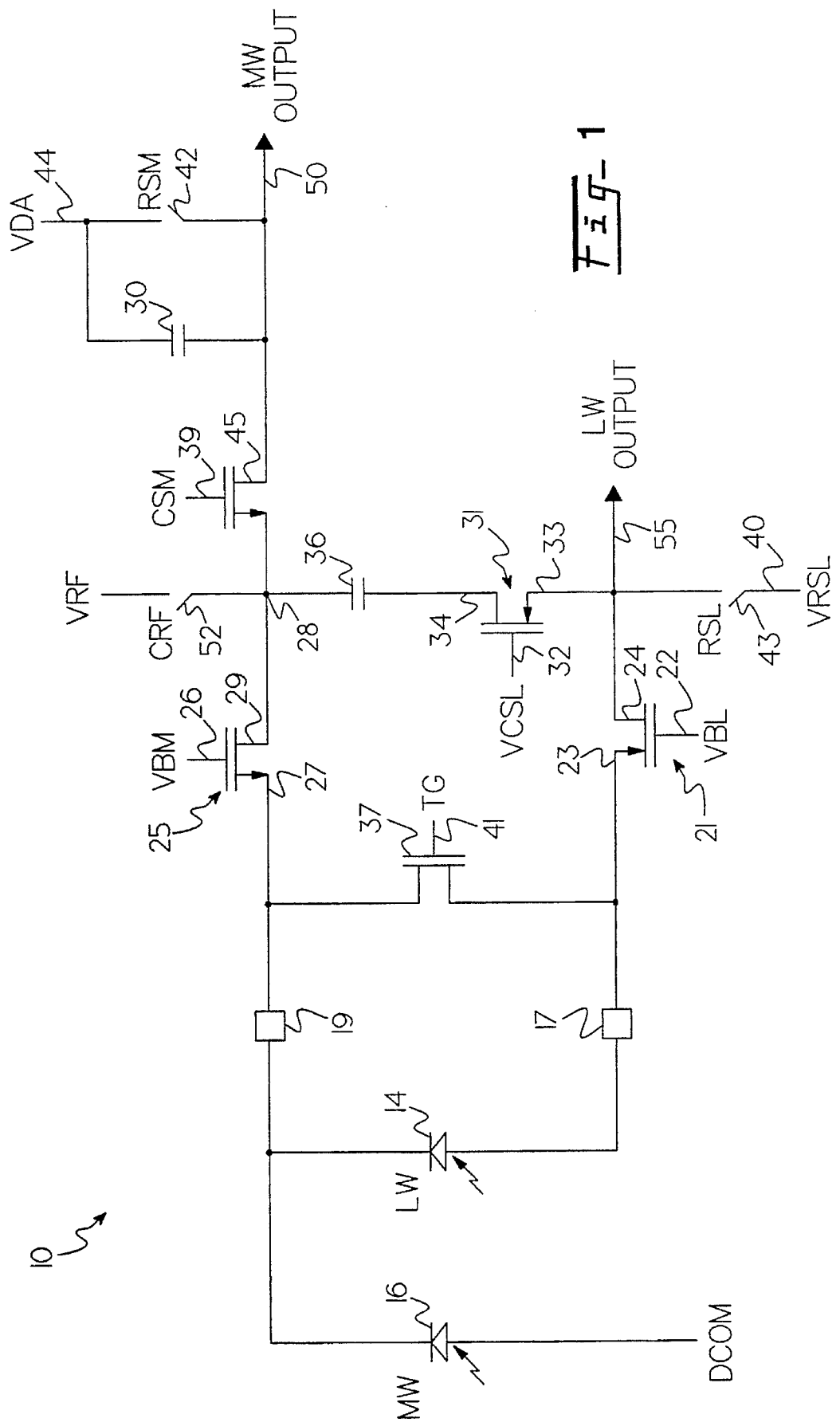
FIG. 1 shows a schematic circuit diagram of the double direct injection dual band multiplexer input circuit of the invention.

FIG. 1 shows a schematic circuit diagram of the double direct injection dual band input circuit 10 of the invention. The circuit 10 uses two direct injection input circuits to integrate current from a medium wave (MW) photodiode and a long wave (LW) photodiode simultaneously. In one embodiment the sensors may be constant voltage, variable current sensors with one common connection, one independent connection connected to the input circuit and another independent connection set by an external bias. In one preferred embodiment of the invention, the medium and long wave photodiode may be a HgCdTe type photodiode or equivalent, for example. The outputs of each photodiode, LW and MW, are integrated on separate capacitors, a medium wave integration capacitor 30 and a long wave integration capacitor 36.

A first N channel field effect transistor, FET 25, has its source 27 connected to a common node 19 which connects a medium wave detector 16 and a long wave detector 14. The common node 19 may advantageously be fabricated as an indium bump, or equivalent structure, for example. The FET 25 has its gate 26 connected to a first bias voltage $V_{BM}$. The drain 29 of the FET 25 is connected to cascode node 28. Cascode node 28 is connected to a first terminal of the long wave integration capacitor 36.

The second terminal of the long wave integration capacitor 36 is connected to the drain 34 of a first P channel field effect transistor, FET 31. The FET 31 has a gate 32 connected to a bias voltage $V_{CSL}$. The first P channel FET 31 further has a source 33 connected to both the output of a reset switch RSL 43 and an LW output line 55. The medium wave integration capacitor 30 is connected to the drain 45 of a second N channel FET 39, which is the medium wave output. The medium integration capacitor 30 has a reference voltage supply 44, labeled $V_{DA}$, controlled by reset switch RSM 42.

A second P channel field effect transistor, FET 21, has its source 23 connected to the anode of the long wave detector 14 at node 17. Node 17 may also be fabricated as an indium bump. The FET 21 has its gate 22 connected to a second bias voltage $V_{BL}$. The drain of the FET 21 is connected to LW output line 55. Those skilled in the art will appreciate that other well known alternatives may be employed to connect the detectors to the processing circuitry of the invention, such as wire, cable, metal, printed wiring board interconnections and the like.

Two resets are provided by the circuit 10. A medium wave signal reset is provided by reset switch RSM 42 which couples in $V_{DA}$ reset voltage from voltage supply 44. The long wave reset switch RSL 43 is connected to $V_{RSL}$ reset voltage 40. The long wave output, on LW output line 55, is provided at the common terminal of the long wave integration capacitor 36 and the long wave reset switch RSL 43.

Medium wave diode 16 characteristically has a high impedance. The circuit 10 exploits the low impedance of the direct injection input 27 by operating to allow a long wave photocurrent to be integrated on the long wave integration capacitor 36 and a medium wave photocurrent to be integrated on a medium wave integration capacitor 30. The detector bias is determined by voltage source $V_{BL}$ for the long wave FET 21 and voltage source $V_{BM}$ for the medium wave FET 2S.

In operation the invention provides a circuit that has a dual band input design with a reduction in LW to MW crosstalk. The CSL transistor FET 31 may advantageously comprise a cascode transistor that isolates most of the stray capacitance from the LW integration node of drain 34. Such stray capacitance is the cause of crosstalk from the LW to the MW bands.

The circuit of the invention also permits multiple LW integrations for each MW integration, thereby allowing more flexibility in choice of MW and LW transimpedance gains. An MW cascode transistor, CSM transistor FET 39, isolates the non-integrating side of the LW integration capacitor 36 from the integrating side of the MW integration capacitor. The LW integration capacitor may be DC referenced using cascode reference switch CRF 52 without resetting the integrating node of the MW integration capacitor 30. One terminal of cascode reference switch CRF 52 is connected to a reference voltage VRF. The MW integration cycle resumes where it left off when an LW readout cycle is complete.

The invention also provides a test input circuit for the dual band input. It is desirable to be able to test readout circuits prior to hybridization to avoid connecting good detectors to defective readout circuits. The test input circuit comprises transistor 37 which connects the LW and MW inputs and is controlled by impressing a voltage TG on the base of transistor 37 through line 41. If the circuit operates normally, the current through transistor 37 is integrated in the LW integration capacitor 36. If the LW reset switch RSL 43 is left on, then the current through the test transistor 37 will be integrated in the MW integration capacitor 30. Thus both inputs can be tested prior to hybridization with one transistor. Line 41 provides a test current by turning transistor 37 on. For normal operation of the circuit 10 transistor 37 is turned off.

Timing diagrams illustrating timing employed in one example of the invention are shown in FIGS. 2A–2F which coincide in time as viewed from left to right.

Figure 2:
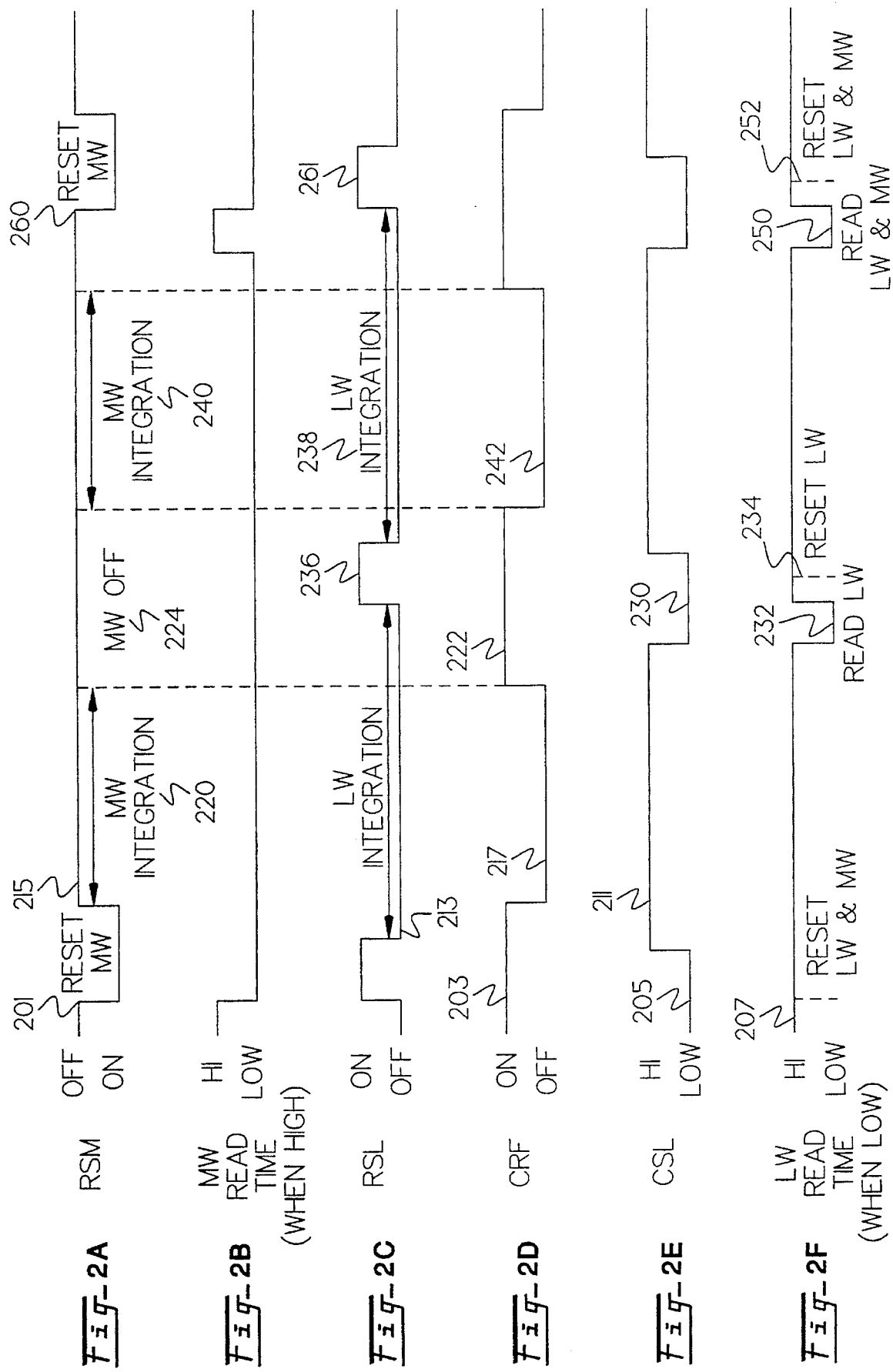
FIGS. 2A, 2B, 2C, 2D, 2E and 2F are timing diagrams which show examples of timing periods employed in one embodiment of this invention.

FIG. 2A shows the status of reset switch RSM 42 which is used to reset the MW integration capacitor 30.

FIG. 2B shows the readout period for the MW signal at MW output 50. FIG. 2C shows the status of RSL reset switch 43 which is engaged to reset the LW integration capacitor 36. FIG. 2D shows the status of cascode reference switch CRF 52. FIG. 2E shows the status of CSL voltage on gate 32 of FET 31. FIG. 2F indicates readout and reset times for MW signals and LW signals.

An integration time begins with the following signals at the indicated states: RSM on at state 201 resets MW, LW reference CRF on at state 203, the LW cascode CSL control set several volts below ground to turn the CSL cascode transistor FET 31 on as a switch at state 205, and reset switch RSL 43 on at state 207. The LW reset voltage should be at ground and $V_{RF}$ should be set just high enough to insure that no current will flow through the CSM transistor FET 39. The LW integration begins first. CSL transistor FET 31 may advantageously be set to operate as a cascode transistor for the LW integration capacitor by setting CSL to approximately 3.5 Volts indicated at state 211. Then the reset switch RSL 43 can be turned off as indicated by state 213. Once the LW cascode node is charged to its operating value and LW integration begins on the LW integration capacitor 36, MW integration can begin.

If it is desired to expedite this charging at node 24, the LW reset voltage, $V_{RSL}$, may be clocked up several volts after CSL has risen to state 211 but prior to RSL going off at state 213. $V_{RSL}$ would return to ground after RSL was turned off at state 213. Reset switch RSM 42, the MW switch, is turned off as indicated by RSM off state 215. The reference switch, CRF switch 52, is turned off as indicated at state 217. When the MW cascode node settles, MW integration begins as generally indicated by state 220.

To read out only the LW signal, the CRF reference switch 52 is turned on at state 222 to shut down the MW integration at state 224 and provide a DC reference to the LW integration capacitor 36. Then CSL transistor FET 31 is turned on by bringing it below ground at state 230. The LW signal can now be read out at LW output 24 as indicated by state 232. After read out, the LW capacitor 36 may be reset at state 234 by switching reset switch RSL 43 on at state 236. LW integration may then be resumed with transistor FET 31 operating as the cascode, and RSL off. After the LW cascode node settles, MW integration resumes at state 240 by turning CRF switch 52 off at state 240 and waiting for the reference node to settle.

To read out MW and LW, the procedure is the same as detailed above except for the addition of a MW read and reset shown at states 250 and 252 respectively. The readout process begins by turning CRF off at state 242. The MW capacitor 30 may now be read out in MW output 50. CSL control voltage is set to about −2 V in one example to enable readout of the LW capacitor. Then reset switch RSM 42 and reset switch RSL 43 are turned on as indicated by states 260 and 261 respectively to reset the MW and LW integration capacitors at state 252. The timing then repeats as shown in FIGS. 2A–2F.

It is also possible to read out the MW signal during LW integration. Timing is not critical since the MW cascode CSM transistor FET 39 isolates the MW integration capacitor 30 from the LW integration capacitor 36. The MW signal may be read out at any time at MW output 50. Following a read the MW signal may be reset by turning RSM on. MW integration begins again when RSM is turned off. LW integration will continue through the MW read and reset.

Since the invention allows multiple long wave integrations for each medium wave integration, the medium wave voltage crosstalk is reduced by the ratio of the integration times. This occurs because only a fraction of the medium wave integration occurs in each long wave integration cycle.

In one preferred embodiment of the invention, the circuit may be constructed using CMOS processing technology. When compared to other conventional circuit technology the resulting CMOS circuit has smaller input cells with improved dynamic range sensitivity and much lower crosstalk.

Those skilled in the art will appreciate that while the specific application for this invention is a dual band infrared focal plane array having a medium wave (MW) infrared detector diode connected to detector common and a long wave (LW) infrared detector diode connected to the non-common side of the MW diode, it is not necessary that the detector input have one MW detector and one LW detector. The circuit will work with any type of constant voltage, variable current and stacked detectors whatever their response, in the optical range or in other ranges.

A stacked detector configuration is any detector configuration where two detectors share a common node and where the common node is not the detector common node. The detector common node is the node that is shorted together across the detector array and connected to an external bias supply voltage. A constant voltage, variable current detector is a configuration where the detectors are kept at a constant bias voltage and the current through them is integrated to generate their response.

Figure 3:
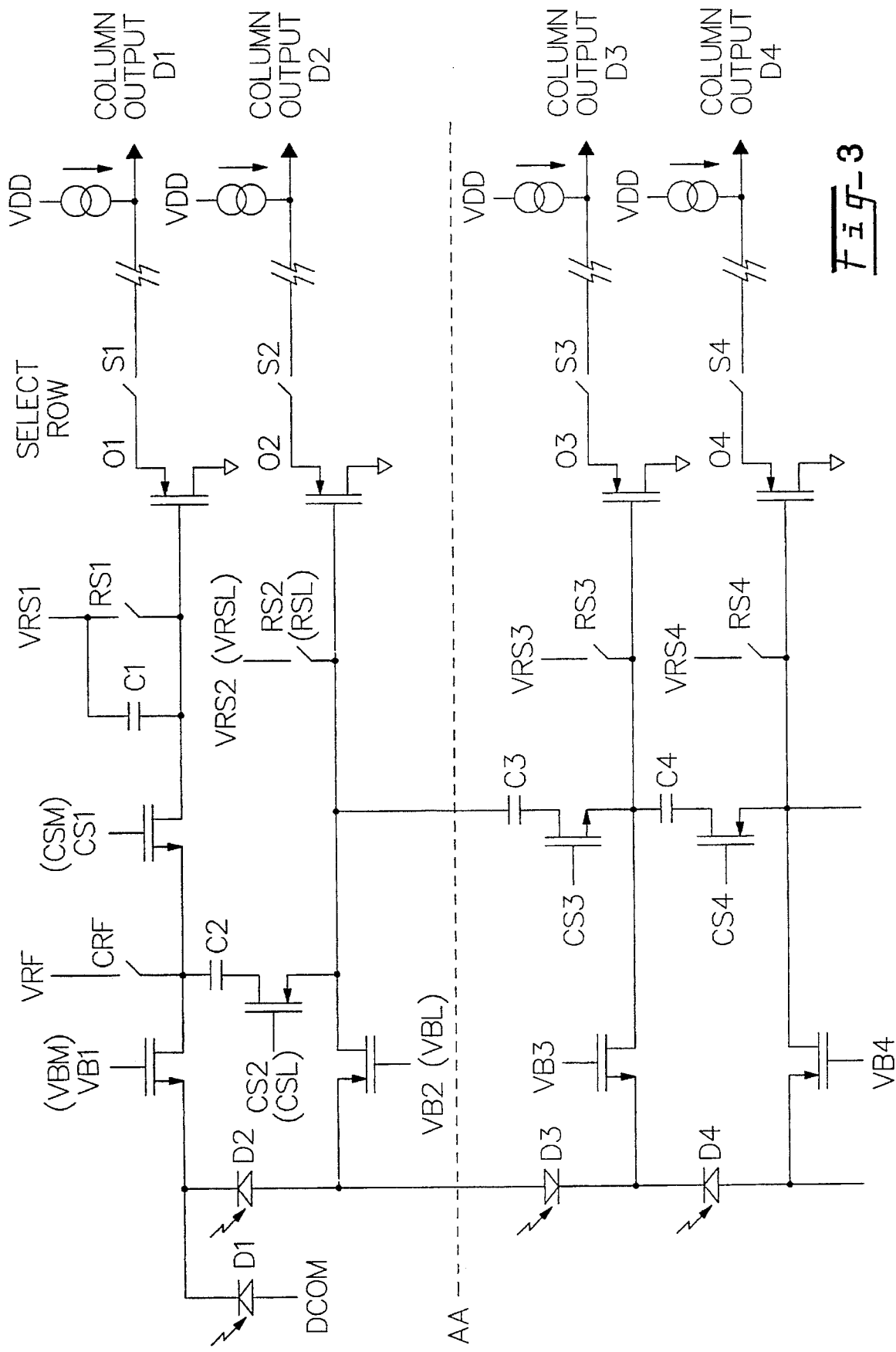
FIG. 3 shows a circuit schematic of the invention used in a multiband configuration.

Now referring to FIG. 3, a schematic diagram illustrates the invention detecting four separate bands. Above line AA, the circuit is similar to the circuit shown in FIG. 1. D1 and D2, and accompanying circuitry, are used to separately detect two separate bands in the manner corresponding to FIG. 1.

Below line AA, FIG. 3 illustrates the manner in which current from additional sensors detecting separate bands may be simultaneously and separately integrated. Detectors D3 and D4, and accompanying circuitry, each constitute a floating stage. Each floating stage detects an added separate band. The operation of the floating stages is similar to the circuit of FIG. 1. The polarity of the stages must be alternated in order to allow the current and shared nodes to flow in the same direction.

Figure 4:
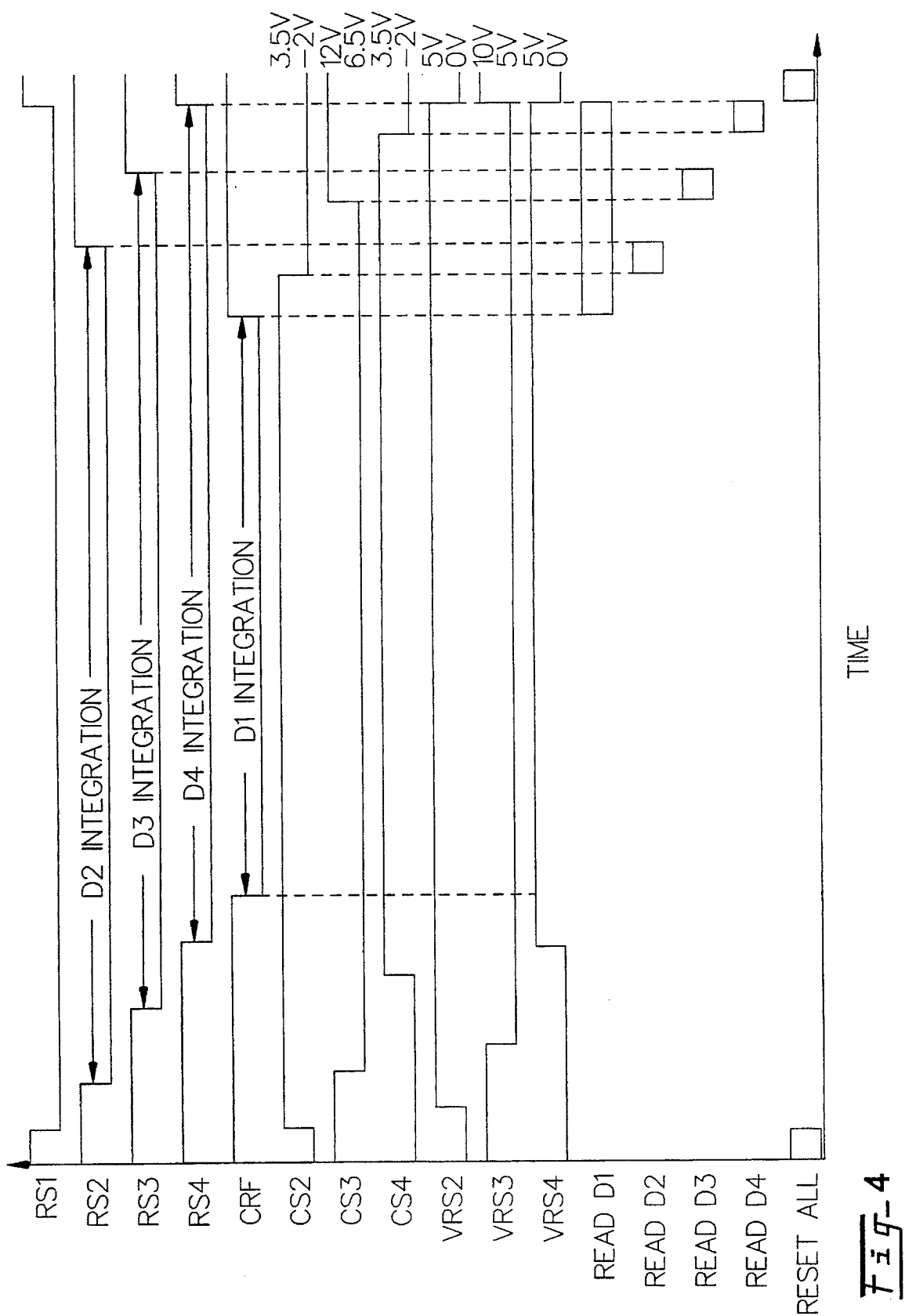
FIG. 4 shows a circuit timing diagram of the multiband configuration.

Reset voltages $V_{RS1}$ through $V_{RS4}$ must be clocked so the voltage is used both to reset the integration capacitor of its associated stage, and to serve as a reference to reset and read the integration capacitor for each stage as well. This reset timing is shown in more detail with reference to FIG. 4. For example, $V_{RS2}$ is used to reset integration capacitor C2, and as a reset and reference for integration capacitor C3. When the signal for integration reset switch RS2 is first on and CS2 is on (low), $V_{RS2}$ is low, for example, at zero volts, to reset C2. Then, after CS2 goes high, for example, to 3.5 volts, as a cascode and RS2 is still on, $V_{RS2}$ goes higher, for example, up to 5 volts, to serve as a reset reference for capacitor C3. The other side of C3 is reset by $V_{RS3}$ high, for example, at 10 volts, with CS3 high, for example, at 12 volts, as a switch. RS2 turns off to allow C2 integration to begin. When C3 is ready to read out, RS2 must be turned on again to allow $V_{RS2}$ high, for example, at 5 volts, to be used as a reference for integration capacitor C3.

As with the circuit of FIG. 1, the readout is accomplished by turning on the cascode FET for the output as a switch. In the case of C3, this implies bringing CS3 high, that is to about 4 volts. Those skilled in the art will recognize that it is not necessary to reset all the integration capacitors to readout any of the others, however, integration must be stopped on the lower number outputs to reset and read a higher number one. The circuit allows integration in any of the bands to extend across multiple integrations of the other bands.

The multiplex output buffers are included in order to illustrate how the apparatus of the invention would be used in an array of detectors. The output from detectors D1 to D4 are fed into the gate of output source follower FET O1 to O4. The source of each FET are connected through an associated switch S1 to S4. Switches S1 to S4 are used to select a particular row for which an output is to be placed on a column output bus. In an array of detectors, the column output busses may be shared by all the unit cells in a column to allow the entire column to readout onto one line. The selected row is determined by which unit cell is using the bus at any given time. The current source load $V_{DD}$ for the source followers O1–O4 is located at the end of a column of cells, not in each cell. The columns would then be multiplexed in the following circuit to generate a small number of output lines for the multi-colored array.

The invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A signal processing apparatus comprising:
   (a) a first signal detector having a first signal output, wherein the first signal contains frequencies of a first band;
   (b) a second signal detector having a second signal output, wherein the second signal contains frequencies of a second band; and
   (c) signal integration means for integrating the first signal a plurality of times while the second signal is being integrated once, the signal integration means being coupled to the first signal output and the second signal output.

2. The signal processing apparatus of claim 1 wherein the signal integration means further includes a first integrated circuit integrator coupled to the first signal output for integrating the first signal, and a second integrated circuit integrator coupled to the second signal output for integrating the second signal.

3. The signal processing apparatus of claim 1 further including a plurality of additional signal outputs wherein the signal integrations means further comprises a means for integrating each of the plurality of additional signals during the first signal integration.

4. A double direct injection dual band sensor input circuit comprising:

(a) a first sensor, comprising a constant voltage, variable current sensor, having a first terminal connected to an external bias and an output at a second terminal connected to a common terminal;

(b) a second sensor, comprising a constant voltage, variable current sensor, having a first output at a first terminal connected to the common terminal such that the output from the second terminal of the first sensor and the first output from the first terminal of the second sensor comprise a common output, the second sensor further having a second terminal comprising an independent output having an independent output current;

(c) a common output direct injection input, which controls the bias of the common output and passes the current of the common output to a common injection node;

(d) an independent output direct injection input, which controls the bias of the independent output and passes the independent output current to an independent injection node;

(e) a first integration circuit which integrates the current of the output from the first sensor through the common injection node and periodically resets to restart the integration;

(f) a second integration circuit which is connected across the common and independent injection nodes to float so as to integrate only the current from the first output of the second sensor, and which periodically resets to restart the integration;

(g) a common injection node cascode circuit which buffers the first sensor integration from the second sensor integration;

(h) an independent injection node cascode circuit which reduces the stray capacitance on a floating integration capacitor of the second sensor; and, (i) a test input for testing the double direct injection dual band sensor input circuit without the first and second sensors attached.

5. The dual band circuit of claim 4 wherein the first and second sensors comprise a first and second HgCdTe photodiode, respectively, wherein the first and second HgCdTe photodiodes respond to different wavelengths of infrared radiation.

6. The dual band circuit of claim 4 wherein the first and second integration circuits comprise a first and second integration capacitor, respectively, the first and second capacitors having reset switches.

7. The dual band circuit of claim 6 wherein the common injection node cascode circuit comprises a common cascode FET and a switch to a reference voltage.

8. The dual band circuit of claim 7 wherein the independent injection node cascode circuit comprises an independent cascode FET connected to the integration side of the floating integration capacitor.

9. The dual band circuit of claim 4 wherein the test input is a FET in parallel with the second sensor.

10. The dual band circuit of claim 4 wherein the second sensor is a long wave HgCdTe diode.

11. A method of operation of a dual band circuit comprising the steps of:

(a) switching on a reference voltage of a common injection node cascode circuit;

(b) resetting a first and second integration capacitors;

(c) turning on an independent cascode FET to begin charging the independent cascode FET;

(d) adjusting an independent cascode FET to operate as a cascode FET;

(e) adjusting a reset level of a second integration circuit to reduce independent cascode FET charge time;

(f) turning off a reset switch to start integration of a second sensor by the second integration capacitor;

(g) after the independent cascode FET is charged, switching off the reference voltage of the common injection node cascode circuit to start integration of a first sensor by the first integration capacitor;

(h) repeating steps (a) through (g) for as long as integration is desired;

(i) when integration is no longer desired, switching off the reference voltage of the common injection node cascode circuit to end integration of the first sensor;

(j) reading the output voltage of the first sensor from the first integration capacitor;

(k) turning on the independent cascode FET so that the integration of the second sensor continues;

(l) reading the voltage of the independent output of the second sensor at the independent injection node; and (m) resetting the first and second integration capacitors to end the integration of the second sensor.

12. A dual band sensor circuit comprising:

(a) a medium wave photodetector having a medium wave photocurrent output;

(b) a long wave photodetector having a long wave photocurrent output, wherein the long wave photocurrent output is connected to the medium wave photocurrent output;

(c) a medium wave voltage bias means for biasing the medium wave photocurrent output, wherein the medium wave voltage bias means has a medium wave biased photocurrent output and a medium wave voltage input connected to the medium wave photocurrent output;

(d) a long wave voltage bias means connected to bias the long wave photocurrent output, wherein the long wave voltage bias means has a long wave biased photocurrent output and a long wave voltage input connected to the long wave photocurrent output;

(e) a medium wave photocurrent integration means for integrating the medium wave biased photocurrent output, wherein the medium wave photocurrent integration means has a reference voltage input;

(f) a long wave photocurrent integration means for integrating the long wave biased photocurrent output connected to the long wave biased photocurrent output and the medium wave biased photocurrent output;

(g) a long wave reset means for resetting the long wave photocurrent integration means to a predetermined long wave reset voltage;

(h) a medium wave reset means for resetting the medium wave photocurrent integration means to a predetermined medium wave reset voltage; and (i) switch means for floating the medium wave photocurrent integration means having a float control output connected to the reference voltage input.

13. The dual band sensor circuit of claim 12 wherein the long wave photodetector is a HgCdTe diode.

14. The dual band sensor circuit of claim 12 wherein the medium wave photodetector is a HgCdTe diode.

15. The dual band sensor circuit of claim 12 wherein the long wave voltage bias means comprises an n-channel field effect transistor.

16. The dual band sensor circuit of claim 12 wherein the medium wave voltage bias means comprises a p-channel field effect transistor.

17. A method of double direct injection integration comprising the steps of:

(a) initiating an integration cycle by resetting medium wave and long wave reset switches and a reference switch;

(b) setting the long wave reset voltage to ground;

(c) setting the medium wave reset voltage to a predetermined voltage;

(d) setting a reference voltage to a predetermined DC value;

(e) turning off the medium wave and long wave reset switches;

(f) waiting a predetermined time for long wave integration;

(g) turning off the reference switch to float a medium wave integration capacitor; and (h) turning on the medium wave reset switch to provide a DC restore to a floating long wave integration capacitor.

18. The method of claim 17 further comprising a method for reading a long wave output comprising the steps of:

(a) resetting the floating long wave capacitor by turning on a long wave reset;

(b) turning off the long wave reset switch to start the integration cycle; and (c) turning off the medium wave reset switch to end the long wave integration cycle.

19. A signal processing apparatus comprising:

(a) a medium wave photodetector with a medium wave signal output;

(b) a long wave photodetector with a long wave output;

(c) a test transistor connected across the long wave photodetector;

(d) a long wave bias transistor connected in series with the long wave photodetector, wherein the long wave bias transistor receives the long wave output and provides a biased long wave output;

(e) a medium wave bias transistor connected in series with the medium wave photodetector, wherein the medium wave photodetector receives the medium wave signal output and provides a biased medium wave output;

(f) a resetable long wave integration capacitor in series with the long wave bias transistor, wherein the resetable long wave integration capacitor provides a long wave integration output;

(g) a medium wave isolation transistor in series with the medium wave bias transistor to isolate medium wave integration in response to an isolation signal; and (h) a resetable medium wave integration capacitor in series with the medium wave isolation transistor, wherein the resetable medium wave integration capacitor provides a medium wave integration output.

* * * * *

UNITED STATES PATENT AND TRADEMARK OFFICE
CERTIFICATE OF CORRECTION

PATENT NO.  :  5,523,570
DATED       :  June 4, 1996
INVENTOR(S) :  Hairston

It is certified that error appears in the above-identified patent and that said Letters Patent is hereby corrected as shown below:

On the title page item [57],
<u>In the Abstract</u>

The last line, after the word "used" insert -- to --.

Column 1, delete line 16 and replace it with -- U.S. Pat. No. 4,956,686 to

Sebastian R. Borrello et al., --.

Column 3, line 47, after the word "FET", delete "2S" and replace it with -- 25 --.

Signed and Sealed this

Tenth Day of November 1998

*Attest:*

BRUCE LEHMAN

*Attesting Officer*      *Commissioner of Patents and Trademarks*